(12) United States Patent
Origasa (10) Patent No.: US 7,733,735 B2
(45) Date of Patent: Jun. 8, 2010

(54) SEMICONDUCTOR STORAGE DEVICE INCORPORATED INTO A SYSTEM LSI WITH FINER DESIGN RULES

(75) Inventor: Kenichi Origasa, Osaka (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 12/115,921

(22) Filed: May 6, 2008

(65) Prior Publication Data

US 2008/0291717 A1    Nov. 27, 2008

(30) Foreign Application Priority Data

May 21, 2007 (JP) .............. 2007-133578

(51) Int. Cl.
*G11C 11/00* (2006.01)
(52) U.S. Cl. .............. 365/230.06; 365/189.05; 365/189.11
(58) Field of Classification Search ......... 365/230.06, 365/189.05, 189.11
See application file for complete search history.

(56) References Cited

U.S. PATENT DOCUMENTS

| 5,617,369 | A | | 4/1997 | Tomishima et al. | |
|---|---|---|---|---|---|
| 5,870,348 | A | | 2/1999 | Tomishima et al. | |
| 5,886,942 | A | * | 3/1999 | Akita | 365/230.06 |
| 6,009,023 | A | | 12/1999 | Lu et al. | |
| 6,072,748 | A | * | 6/2000 | Iwahashi | 365/230.06 |
| 6,091,647 | A | * | 7/2000 | Hidaka et al. | 365/189.09 |
| 6,097,665 | A | | 8/2000 | Tomishima et al. | |
| 6,166,987 | A | * | 12/2000 | Atsumi et al. | 365/230.06 |
| 6,377,508 | B1 | | 4/2002 | Tomishima et al. | |
| 6,385,159 | B2 | * | 5/2002 | Hidaka et al. | 365/189.09 |
| 6,650,590 | B2 | | 11/2003 | Inaba et al. | |
| 6,661,734 | B2 | * | 12/2003 | Inaba et al. | 365/230.06 |

* cited by examiner

*Primary Examiner*—Son Dinh
(74) *Attorney, Agent, or Firm*—Steptoe & Johnson LLP

(57) ABSTRACT

In the present invention, a row decoder circuit is made up of a transistor having a first gate oxide film thickness, a transistor having a second gate oxide film thickness, and a transistor having a third gate oxide film thickness. Thus even a control circuit at a lower voltage can drive word lines at high speeds while achieving reliability.

13 Claims, 5 Drawing Sheets

SEMICONDUCTOR STORAGE DEVICE INCORPORATED INTO A SYSTEM LSI WITH FINER DESIGN RULES

FIELD OF THE INVENTION

The present invention relates to a semiconductor storage device incorporated into a system LSI with finer design rules.

BACKGROUND OF THE INVENTION

Figure 4:
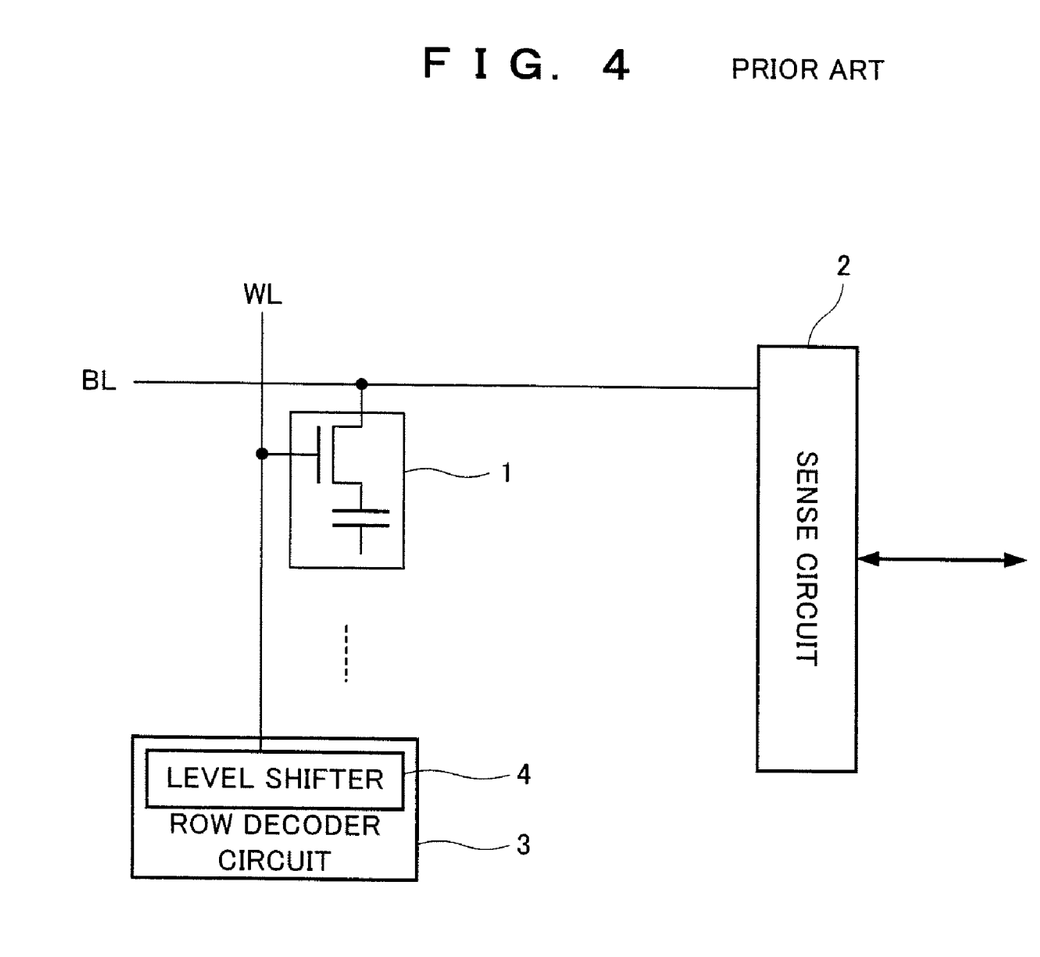
FIG. 4 is a block diagram schematically showing the configuration of a conventional semiconductor storage device.

Conventionally, semiconductor storage devices incorporated into system LSIs with finer design rules (for example, see Japanese patent laid-open publications including Japanese Patent Laid-Open No. 7-307091 and Japanese Patent Laid-Open No. 2002-298579) are configured as shown in FIG. 4.

FIG. 4 is a block diagram showing the configuration of a conventional semiconductor storage device. In FIG. 4, reference numeral 1 denotes a memory cell, reference numeral 2 denotes a sense circuit, reference character WL denotes a word line, reference character BL denotes a bit line, reference numeral 3 denotes a row decoder circuit, and reference numeral 4 denotes a level shifter.

The memory cell 1 is a typical DRAM memory cell. In order to charge a capacitor from an N-channel transistor, a voltage higher than the potential of the bit line BL has to be applied as the potential of the word line WL. Further, in order to suppress the leakage voltage of the N-channel transistor to improve charge retention characteristics, the word line WL generally has a negative voltage when not accessed.

Thus it is necessary to dispose a high breakdown-voltage transistor in the row decoder circuit 3. The high breakdown-voltage transistor has a thicker gate oxide film than a transistor disposed in the sense circuit 2 and so on. For this operation, the level shifter 4 is disposed in the row decoder circuit 3 to operate the word line WL at a control circuit voltage as high as the voltage of the bit line BL.

Figure 5:
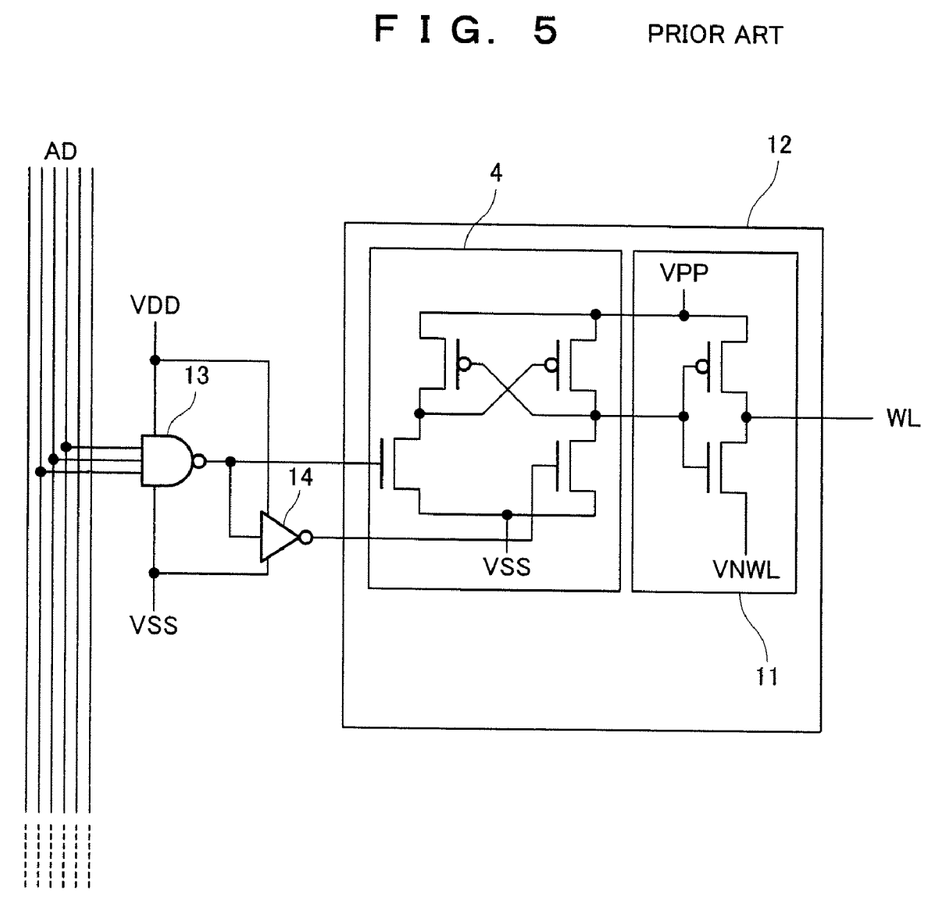
FIG. 5 is a circuit diagram showing the configuration of a row decoder circuit in the conventional semiconductor storage device.

FIG. 5 is a circuit diagram showing the configuration of the row decoder circuit 3 in the conventional semiconductor storage device. In FIG. 5, reference numeral 11 denotes an output inverter, reference numeral 12 denotes a high-breakdown-voltage transistor region where the gate oxide film has a large thickness, reference numeral 13 denotes an NAND element, reference numeral 14 denotes an inverter, and reference character AD denotes a row address signal.

The level shifter 4 is fed with a signal obtained by decoding the row address signal AD through the NAND element 13 and the inverter 14. The input level of the signal is equivalent to a control circuit voltage as high as the voltage of the bit line BL, and thus is relatively low. The output of the level shifter 4 is outputted to the output inverter 11. The output of the output inverter 11 is connected to the word line WL. The output inverter 11 is fed with a high level VPP and a low level VNWL of the word line WL. The level shifter 4 and the output inverter 11 are disposed in the high-breakdown-voltage transistor region 12 where the gate oxide film has a large thickness.

The following is the operating principles of the semiconductor storage device configured thus.

In the sense circuit 2 for reading the data of the memory cell 1, a high density transistor is used for finer design rules in, e.g., the 45-nm generation. The center value of an applicable voltage is about 1.0 V to 1.2 V and the gate oxide film is about 1.5 nm in thickness. The word line WL requires 2.0 V which is increased from the center value by the threshold voltage of the N-channel transistor of the memory cell 1, and the negative voltage of the word line WL is set at about −0.4 V in consideration of characteristics (GIDL) that the leakage current of a drain is increased by the application of a gate voltage at a low level. Thus generally, the high breakdown-voltage transistor in the row decoder circuit 3 includes a gate oxide film which is at least 5 nm in thickness, and has a threshold voltage of at least 0.6 V.

In this case, in order to operate the level shifter 4, a stable voltage of at least 0.6 V has to be supplied to the input of the level shifter 4. Since the input has a center value of about 1.0 V to 1.2 V, the worst voltage is about 0.8 V. The level shifter 4 has a cross-coupled configuration of a P-channel transistor. The level shifter 4 is operated such that the drain voltage of the P-channel transistor is reduced to the source potential of an N-channel transistor by the N-channel transistor connected to a side where the P-channel transistor is turned on, so that the cross-coupled phase of the P-channel transistor is inverted and the output is also inverted. Since a high voltage output can be obtained even by a low input voltage, the level shifter 4 configured thus is widely used.

For operations, however, the high level of the input has to be sufficiently higher than the threshold voltage of the N-channel transistor.

However, in the conventional semiconductor storage device, relative to the worst value of 0.8 V at a high level of the input, the transistor composing the level shifter 4 has a threshold voltage of at least 0.6 V in the 45-nm generation and so on responding to finer design rules. Thus the threshold voltage is not sufficiently high.

In the case where the input voltage is close to the threshold value, the size of the N-channel transistor has to be set at least 20 times as large as the size of the P-channel transistor in order to increase the capability of the N-channel transistor relative to the capability of the P-channel transistor, thereby increasing the size and load of the circuit. Thus it is difficult to perform high-speed operations.

DISCLOSURE OF THE INVENTION

The present invention is devised to solve the conventional problem. An object of the present invention is to provide a semiconductor storage device which can suppress an increase in circuit size and achieve a stable high-speed operation while allowing constituent transistors to have sufficient operating capabilities, even when the semiconductor storage device is incorporated into a system LSI with finer design rules.

In order to solve the problem, the semiconductor storage device of the present invention includes memory cells, word lines connected to the memory cells, a row decoder circuit connected to the word lines, and a control circuit for controlling the access of the row decoder circuit to the memory cells through the word lines, wherein the control circuit is made up of a transistor in which a gate oxide film has a first thickness, and the row decoder circuit is made up of a transistor in which the gate oxide film has the first thickness, a transistor in which the gate oxide film has a second thickness larger than the first thickness, and a transistor in which the gate oxide film has a third thickness larger than the second thickness.

As described above, according to the present invention, the word lines at a high voltage can be operated at high speeds with high reliability in response to a control signal from the control circuit at a low voltage by a transistor circuit which is disposed between the control circuit and the word lines and includes a gate oxide film having a thickness between the thicknesses of the gate oxide film of the control circuit and the word lines.

Thus even when the semiconductor storage device is incorporated into a system LSI with finer design rules, it is possible to suppress an increase in circuit size and achieve a stable high-speed operation while allowing constituent transistors to have sufficient operating capabilities.

DESCRIPTION OF THE EMBODIMENT

A first configuration of a semiconductor storage device according to an embodiment of the present invention includes, as a basic concept, memory cells, word lines connected to the memory cells, a row decoder circuit connected to the word lines, and a control circuit for controlling the access of the row decoder circuit to the memory cells through the word lines, wherein the control circuit is made up of a transistor in which a gate oxide film has a first thickness, and the row decoder circuit is made up of a transistor in which the gate oxide film has the first thickness, a transistor in which the gate oxide film has a second thickness larger than the first thickness, and a transistor in which the gate oxide film has a third thickness larger than the second thickness.

With this configuration, the word lines at a high voltage can be quickly operated with high reliability in response to a control signal from the control circuit at a low voltage by a transistor circuit which is disposed between the control circuit and the word lines and includes the gate oxide film having a thickness between the thicknesses of the gate oxide film of the control circuit and the word lines.

As a second configuration, the first configuration further includes a level shift circuit in a gate oxide film region having the second thickness.

With this configuration, it is possible to quickly transmit a signal from the control circuit to the word lines.

As a third configuration, in the first configuration, a negative voltage to be applied to the word lines is supplied to a gate oxide film region having the third thickness.

With this configuration, it is possible to improve performance such as the charge retention characteristics of the memory cells.

As a fourth configuration, in the first configuration, the gate oxide film includes a region having the third thickness and the region is equal in thickness to an I/O region used for conveying data to the outside.

With this configuration, it is possible to simplify a manufacturing process without reducing reliability.

As a fifth configuration, in the third configuration, the negative voltage is lower than a ground voltage and is not lower than an absolute value between the ground voltage and the threshold voltage of the transistor in which the gate oxide film has the third thickness.

With this configuration, it is not necessary to dispose the level shift circuit in the gate oxide film region having the third thickness, thereby simplifying the circuit.

As a sixth configuration, in the first configuration, the gate oxide film includes a region having the second thickness and the region is equal in thickness to the memory cell.

With this configuration, it is possible to simplify the manufacturing process without reducing the reliability.

As a seventh configuration, in the second configuration, the semiconductor storage device further includes word drivers for driving the word lines in the gate oxide film region having the third thickness, and the level shift circuit is connected to the plurality of word drivers.

With this configuration, it is possible to reduce a circuit area.

As an eighth configuration, in the first configuration, the semiconductor storage device further includes word drivers for driving the word lines in the gate oxide film region having the third thickness, and the word drivers have the function of latching the word lines at a low level.

With this configuration, it is possible to further reduce the circuit area.

As a ninth configuration, in the second configuration, the semiconductor storage device further includes word drivers for driving the word lines in the gate oxide film region having the third thickness, the word drivers have the function of latching the word lines at a low level, and the level shift circuit is connected to the plurality of word drivers and selectively disables the latching function of the word drivers.

With this configuration, it is possible to further reduce the circuit area.

As a tenth configuration, in the third configuration, the memory cell is a DRAM memory cell made up of an N-channel transistor and a capacitor, the semiconductor storage device further includes word drivers for driving the word lines in the gate oxide film region having the third thickness, the word driver includes a driver transistor having the source connected to the negative voltage and the drain connected to the word line, and the driver transistor has a low-level gate voltage equal to a ground voltage.

With this configuration, it is possible to further reduce the circuit area.

As an eleventh configuration, in the tenth configuration, the semiconductor storage device further includes a level shift circuit in the gate oxide film region having the second thickness, the level shift circuit has an output to a selector circuit, and the plurality of word drivers are connected to the selector circuit.

As a twelfth configuration, in the eleventh configuration, the selector circuit is made up of a plurality of transistors having commonly connected sources, the common sources are fed with the output of the level shift circuit, and the plurality of transistors have outputs respectively connected to the plurality of word drivers.

As a thirteenth configuration, in the twelfth configuration, the level shift circuit has an H level lower than the H level of the word line.

A semiconductor storage device according to the embodiment of the present invention will be specifically described below with reference to the accompanying drawings.

Figure 1:
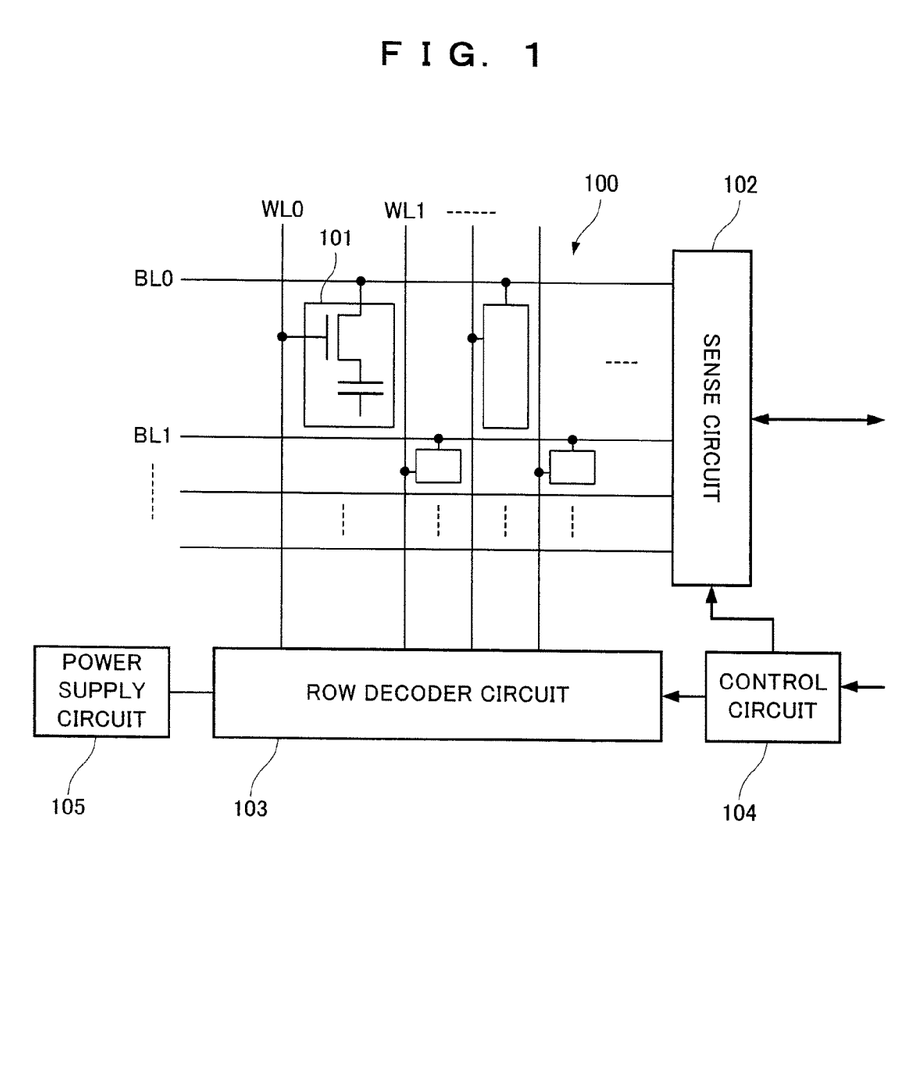
FIG. 1 is a block diagram showing the configuration of a semiconductor storage device according to an embodiment of the present invention.

FIG. 1 is a block diagram showing the configuration of the semiconductor storage device according to the present embodiment. In FIG. 1, reference numeral 100 denotes a memory array, reference numeral 101 denotes a memory cell, reference numeral 102 denotes a sense circuit, reference numeral 103 denotes a row decoder circuit, reference numeral 104 denotes a control circuit, reference numeral 105 denotes a power supply circuit, reference character WLn (n=0, 1, ... N, N represents an integer) denotes word lines, and BLm (m=0, 1, ... M, M represents an integer) denotes bit lines.

In the memory array 100, the memory cells 101 are arranged in an array. The memory cell 101 is disposed on the intersection point of the word line WLn and the bit line BLm as needed. The word lines WLn are connected to the row decoder circuit 103. The bit lines BLm are connected to the sense circuit 102. The row decoder circuit 103 and the sense circuit 102 are controlled from the control circuit 104. Further, the power supply circuit 105 for generating the powers of the word lines WLn is connected to the row decoder circuit 103.

Figure 2:
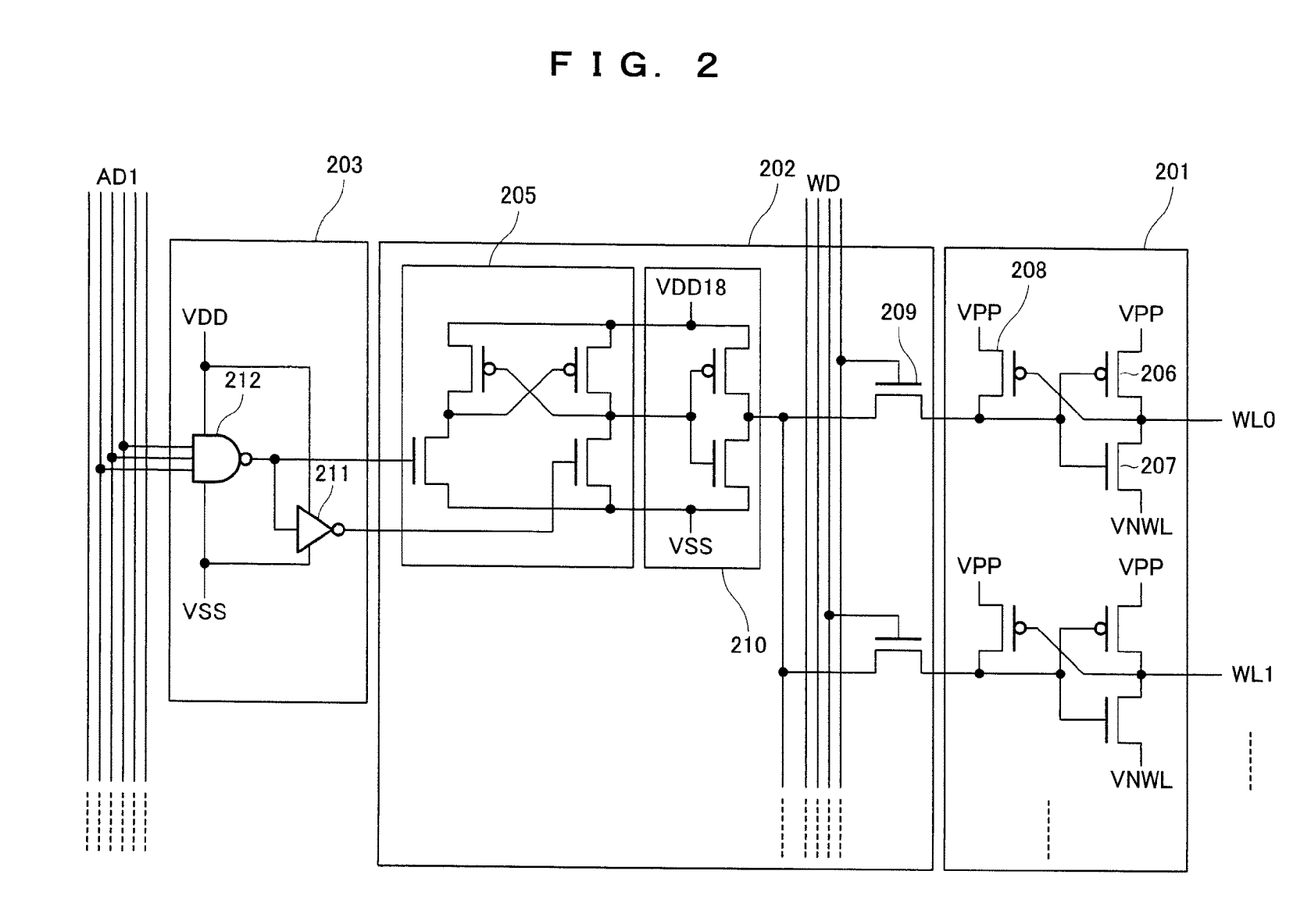
FIG. 2 is a circuit diagram showing the configuration of a row decoder circuit in the semiconductor storage device of the embodiment.

FIG. 2 is a circuit diagram showing the configuration of the row decoder circuit 103 in the semiconductor storage device according to the present embodiment. In FIG. 2, reference character VPP denotes the high level (H) of the word line WLn, reference character VNWL denotes the low level (L) of the word line WLn, reference character VSS denotes a ground voltage, reference character VDD denotes a potential supplied to the control circuit 104, reference numeral 201 denotes a transistor region having a first gate oxide film thickness, reference numeral 202 denotes a transistor region having a second gate oxide film thickness, reference numeral 203 denotes a transistor region having a third gate oxide film thickness, reference character VDD18 denotes a voltage supplied to the transistor region 202 having the second gate oxide film thickness, reference numeral 205 denotes a level shifter, reference numeral 210 denotes an output inverter circuit, reference numeral 211 denotes an inverter, reference numeral 212 denotes an NAND element, reference character WD denotes a first word line selection signal, and reference character AD1 denotes a second word line selection signal. The second word line selection signal AD1 is inputted from the control circuit 104.

In the transistor region 201 having the first gate oxide film thickness, P-channel transistors and N-channel transistors are disposed and the first gate oxide film thickness is larger than the second gate oxide film thickness and the third gate oxide film thickness, so that reliability can be obtained even when a higher voltage is applied to the constituent transistors.

The following will describe an example of a word line circuit for achieving logic for driving the word lines WLn.

In the transistor region 201 having the first gate oxide film thickness, the high level VPP of the word line is applied to the source of a P-channel transistor 206 and the drain of the P-channel transistor 206 is connected to the word line WLn. An N-channel transistor 207 has the source connected to the low level VNWL of the word line and the drain connected to the word line WLn. The gates of the P-channel transistor 206 and the N-channel transistor 207 are connected to the drain of a P-channel transistor 208, the gate of the P-channel transistor 208 is connected to the word line WLn, and the source of the P-channel transistor 208 is fed with the high level VPP of the word line.

The low level VNWL of the word line is a negative voltage lower than the ground voltage VSS. The high level VPP and the low level VNWL of the word line are supplied from the power supply circuit 105.

In the transistor region 202 having the second gate oxide film thickness, P-channel transistors and N-channel transistors are disposed and the second gate oxide film thickness is smaller than the first gate oxide film thickness and is larger than the third gate oxide film thickness.

The following is an example of the decoder circuit for achieving logic for driving the word lines.

An N-channel transistor 209 is connected between the P-channel transistor 208 and an output inverter circuit 210. The gate of the N-channel transistor 209 is connected to the first word line selection signal WD. The output inverter circuit 210 has a current supply capability sufficiently larger than the capability of the P-channel transistor 208. The output inverter circuit 210 is a typical inverter circuit. The output of the level shifter 205 is disposed on the input of the output inverter circuit 210.

The level shifter 205 is a typical level shifter. The level shifter 205 is made up of P-channel transistors and N-channel transistors and is fed with the voltage VDD18 and the ground voltage VSS. The gates of the N-channel transistors in the level shifter 205 are fed with outputs from the elements of the transistor region 203 having the third gate oxide film thickness.

In many cases, the gate oxide film in the transistor region 202 having the second gate oxide film thickness can be equal to the gate oxide film thickness of the transistor composing the memory cell 101. In this case, the manufacturing process can be shortened.

In the transistor region 203 having the third gate oxide film thickness, a P-channel transistor and an N-channel transistor are disposed. The third gate oxide film thickness is smaller than the first gate oxide film thickness and the second gate oxide film thickness.

The following is an example of the decoder circuit for achieving logic for driving the word lines disposed in this region.

The NAND element 212 is fed with the second word line selection signal AD1, and the output of the NAND element 212 is inputted to the inverter 211 and the level shifter 205. The NAND element 212 and the inverter 211 are fed with the potential VDD supplied to the control circuit 104 and the ground voltage VSS.

Figure 3:
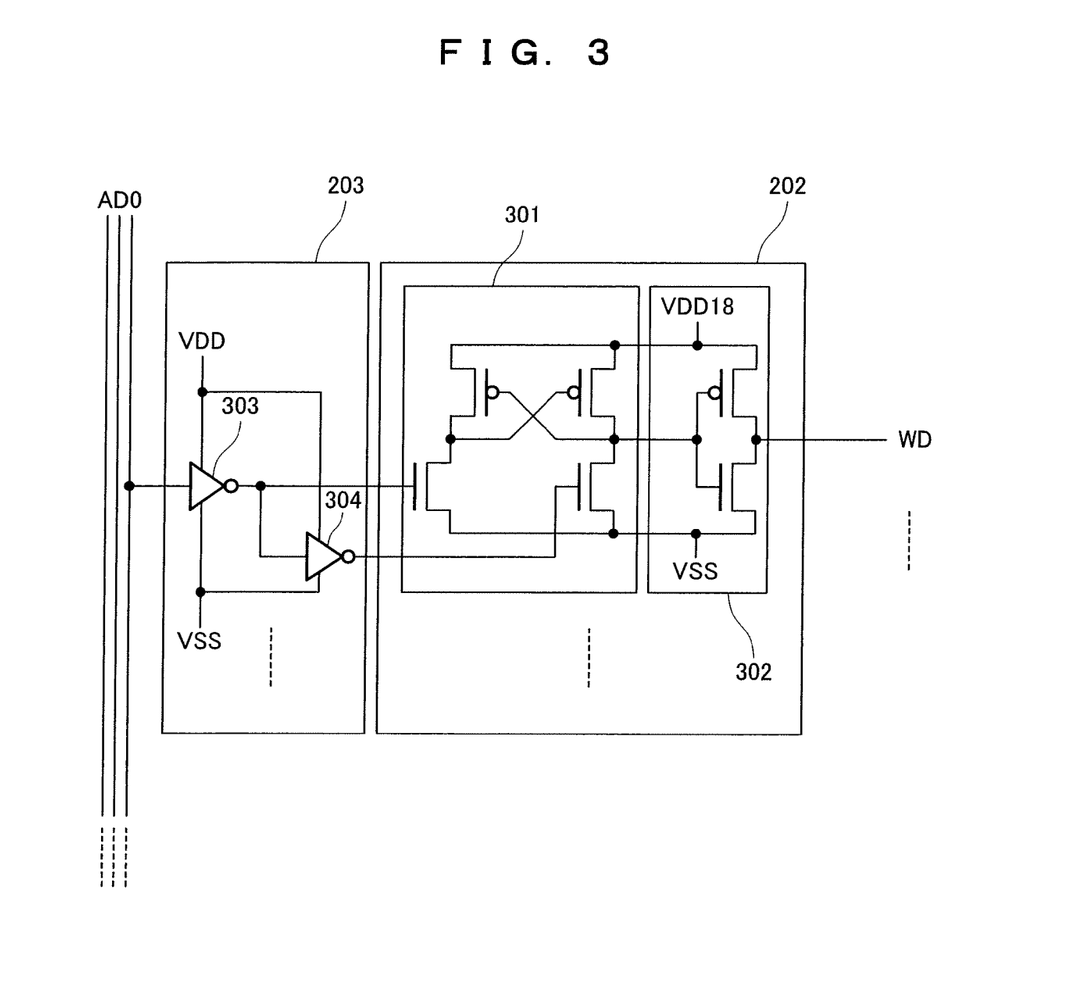
FIG. 3 is a circuit diagram showing the configuration of a circuit for generating a word line selection signal WD of the row decoder circuit in the semiconductor storage device of the embodiment.

FIG. 3 is a circuit diagram showing the configuration of a level converter circuit for generating the first word line selection signal WD in the row decoder circuit of the semiconductor storage device according to the present embodiment. The level converter circuit is disposed in the row decoder circuit 103 as in the circuit of FIG. 2.

In FIG. 3, reference numeral 301 denotes a level shifter and reference numeral 302 denotes an output inverter circuit. The level shifter 301 and the output inverter circuit 302 are disposed in the transistor region 202 having the second gate oxide film thickness. Reference numerals 303 and 304 denote inverters disposed in the transistor region 203 having the third gate oxide film thickness. Reference character AD0 denotes a third word line selection signal to be level shifted to the first word line selection signal WD. The signal is level shifted by a configuration described below. The number of disposed circuits is the same as the number of AD0. The third word line selection signals AD0 are inputted from the control circuit 104.

The first word line selection signal WD is outputted from the output inverter circuit 302. The output inverter circuit 302 is fed with the output of the level shifter 301. The level shifter 301 is fed with the outputs of the inverters 303 and 304 disposed in the transistor region 203 having the third gate oxide film thickness. The voltage VDD18 and the ground voltage VSS are applied to the output inverter circuit 302 and the level shifter 301.

The input of the inverter 304 is connected to the output of the inverter 303, and the input of the inverter 303 is fed with the third word line selection signal AD0. The voltage VDD and the ground voltage VSS are applied to the inverters 303 and 304.

The following will describe the operating principles of the circuit configured thus.

Generally, the sense circuit 102 for reading the data of the memory cells 101 is a high-density transistor having the same gate oxide film thickness as the control circuit 104 in response to finer design rules. The gate oxide film thickness in the region of the sense circuit 102 is equal to the third gate oxide film thickness of the transistor region 203. For example, in the 45-nm generation, an applicable voltage is about 1.0 V to 1.2 V and a gate oxide film thickness is about 1.5 nm.

In order to sufficiently operate the memory cells 101, a voltage increased by the threshold value of the transistor from a voltage applicable to the region is applied in most instances. In this case, the transistors of the memory cells 101 can be the transistors in the region 202 having the second gate oxide film thickness. For example, in the 45-nm generation, an applicable voltage is about 1.8 V and a gate oxide film thickness is about 3.5 nm.

In the transistor region 202 having the second gate oxide film thickness, the threshold voltages of the transistors are set at about 0.3 V to 0.5 V. Further, it is generally known that the low level voltages VNWL set at negative voltages on the word lines WLn are effective in improving the retention characteristics of the charge of the memory cells 101. A proper voltage is set as a low level voltage in view of characteristics (GIDL) that the leakage current of a drain is increased by the application of a gate voltage. When a device has a gate oxide film thickness of about 3.5 nm, the low level voltage is generally set at about −0.4 V.

A word driver circuit for achieving such a low level voltage is disposed in the transistor region 201 having the first gate oxide film thickness. The word driver circuit requires a breakdown voltage of about 2.2 V in response to the voltage range of 1.8 V to −0.4 V of VPP to VNWL, and it is necessary to set the thickness of the gate oxide film at least 5 nm in the transistor region 201 having the first gate oxide film thickness. For example, in the 45-nm generation, a 3.3-V transistor (widely used for an I/O and so on) can be used as it is. Moreover, in the transistor region 201 having the first gate oxide film thickness, the threshold voltages of the transistors are set at about 0.5 V to 0.7 V to suppress leakage voltage.

In the semiconductor storage device of the present embodiment, stable operations can be performed by the following principles:

The level shifter 205 and the level shifter 301 are disposed in the transistor region 202 having the second gate oxide film thickness and a threshold voltage lower than the threshold voltage of the transistor region 201 having the first gate oxide film thickness and including the word driver circuit of the final stage for directly driving the word lines WLn. Thus the level shifter 205 and the level shifter 301 can be sufficiently operated even when the VDD voltage of the control circuit 104 drops, that is, the input voltage drops.

With these operations, the levels of the third word line selection signals AD0 and AD1 ranging between VDD and VSS can be converted to the levels of signals ranging between VDD18 and VSS. Further, the output of the transistor region 202 drives the circuit of the transistor region 201 having the first gate oxide film thickness and a higher threshold voltage. The level conversion enables stable high-speed operations.

Moreover, the high levels VPP and the low levels VNWL of the word lines WLn are applied to the transistors of the transistor region 201 having the first gate oxide film thickness. When the transistor in the region 201 has a threshold voltage of VT201, VPP can be operated in the range of VPP<VDD18+VT201 and VNWL can be operated at a negative voltage in the range of VNWL>VSS−VT201.

As described above, when the transistor in the transistor region 202 having the second gate oxide film thickness has a gate oxide film of about 3.5 nm, the VDD18 is 1.8 V in standard conditions. Thus operations can be performed in a range from VPP<2.4 V to VNWL >−0.6 V.

What is claimed is:

1. A semiconductor storage device, comprising:
   memory cells;
   word lines connected to the memory cells;
   a row decoder circuit connected to the word lines; and
   a control circuit for controlling access of the row decoder circuit to the memory cells through the word lines,
   wherein the control circuit is made up of a transistor in which a gate oxide film has a first thickness, and
   the row decoder circuit is made up of a transistor in which the gate oxide film has the first thickness,
   a transistor in which the gate oxide film has a second thickness larger than the first thickness, and
   a transistor in which the gate oxide film has a third thickness larger than the second thickness.

2. The semiconductor storage device according to claim 1, further comprising a level shift circuit in a gate oxide film region having the second thickness.

3. The semiconductor storage device according to claim 1, wherein a negative voltage to be applied to the word lines is supplied to a gate oxide film region having the third thickness.

4. The semiconductor storage device according to claim 1, wherein the gate oxide film comprises a region having the third thickness and the region is equal in thickness to an I/O region used for conveying data to outside.

5. The semiconductor storage device according to claim 3, wherein the negative voltage is lower than a ground voltage and is not lower than an absolute value between the ground voltage and a threshold voltage of the transistor in which the gate oxide film has the third thickness.

6. The semiconductor storage device according to claim 1, wherein the gate oxide film comprises a region having the second thickness and the region is equal in thickness to the memory cell.

7. The semiconductor storage device according to claim 2, further comprising word drivers for driving the word lines in a gate oxide film region having the third thickness, and
   the level shift circuit is connected to the plurality of word drivers.

8. The semiconductor storage device according to claim 1, further comprising word drivers for driving the word lines in a gate oxide film region having the third thickness, and
   the word drivers have a function of latching the word lines at a low level.

9. The semiconductor storage device according to claim 2, further comprising word drivers for driving the word lines in a gate oxide film region having the third thickness,
   the word drivers have a function of latching the word lines at a low level, and
   the level shift circuit is connected to the plurality of word drivers and selectively disables the latching function of the word drivers.

10. The semiconductor storage device according to claim 3, wherein the memory cell is a DRAM memory cell made up of an N-channel transistor and a capacitor,
   the semiconductor storage device further comprises word drivers for driving the word lines in the gate oxide film region having the third thickness,
   the word driver comprises a driver transistor having a source connected to the negative voltage and a drain connected to the word line, and the driver transistor has a low-level gate voltage equal to a ground voltage.

11. The semiconductor storage device according to claim 10, further comprising a level shift circuit in a gate oxide film region having the second thickness, the level shift circuit has an output to a selector circuit, and
the plurality of word drivers are connected to the selector circuit.

12. The semiconductor storage device according to claim 11, wherein the selector circuit is made up of a plurality of transistors having commonly connected sources, the common sources are fed with the output of the level shift circuit, and
the plurality of transistors have outputs respectively connected to the plurality of word drivers.

13. The semiconductor storage device according to claim 12, wherein the level shift circuit has an H level lower than an H level of the word line.

* * * * *